United States Patent [19]
Kurosaka et al.

[11] Patent Number: 6,042,644
[45] Date of Patent: Mar. 28, 2000

[54] SINGLE CRYSTAL PULLING METHOD

[75] Inventors: Shoei Kurosaka; Hiroshi Inagaki; Shigeki Kawashima; Junsuke Tomioka, all of Kanagawa, Japan

[73] Assignee: Komatsu Electronic Metals Co., Ltd., Kanagawa, Japan

[21] Appl. No.: 09/121,858

[22] Filed: Jul. 24, 1998

[30] Foreign Application Priority Data

Jul. 25, 1997 [JP] Japan ..................... 9-215771

[51] Int. Cl.[7] .................................. C30B 15/32
[52] U.S. Cl. ..................... 117/13; 117/217; 117/218; 117/911
[58] Field of Search ................. 117/13, 14, 15, 117/911, 217, 218

[56] References Cited

U.S. PATENT DOCUMENTS

| | | | |
|---|---|---|---|
| 5,196,086 | 3/1993 | Kida et al. ................ | 117/911 |
| 5,487,355 | 1/1996 | Chiou et al. .............. | 117/13 |
| 5,910,216 | 6/1999 | Nakamura et al. ........ | 117/218 |
| 5,911,821 | 6/1999 | Iino et al. ................. | 117/13 |

*Primary Examiner*—Felisa Hiteshew
*Attorney, Agent, or Firm*—Sughrue, Mion, Zinn Macpeak & Seas, PLLC

[57] ABSTRACT

A single crystal pulling method includes the steps of: immersing seed crystal in a melt; growing single crystal around the seed crystal and reducing its diameter to remove dislocation in the single crystal; prior to forming a straight waist product portion of single crystal having a prescribed diameter, forming a straight waist holding portion having a diameter smaller than the prescribed diameter; holding the straight waist holding portion by using a single crystal holding device; and pulling the straight waist product portion while the straight waist holding portion is held. Preferably the step of forming the straight waist holding portion includes a step of varying a pulling speed to make unevenness in the surface thereof.

14 Claims, 6 Drawing Sheets

Fig 8

| Crystal length(mm) | target diameter |
|---|---|
| b1 | 103 |
| b2 | 97 |
| b3 | 103 |
| b4 | 97 |
| b5 | 103 |
| ... | | gradient= (97−103)/(b2−b1)

SINGLE CRYSTAL PULLING METHOD

BACKGROUND OF THE INVENTION

1. Field of the Invention

The present invention relates to a single crystal pulling method and a single crystal holding device which is mounted in a single crystal fabricating apparatus using the Czochralski process (CZ process) and preferably used to fabricate a single crystal having a large weight.

2. Description of the Prior Art

The single crystal is generally fabricated using the Czochralski process. The CZ process is performed as follows. A quartz crucible, which is installed in a single crystal fabricating device, is filled with a polycrystalline silicon (poly-Si). The poly-Si is heated and made molten by a heater provided around the quartz crucible. Seed crystal, which is attached to a seed holder, is immersed in the melt. While the seed holder and quartz crucible are rotated in the same direction as or an opposite direction to each other, the seed holder is pulled up so that the single crystal silicon is grown to have a predetermined diameter and length.

In the seed crystal, dislocation occurs owing to thermal shock when it is immersed in the melt. In order to remove the dislocation, a neck having a diameter of 3–4 mm is formed in the lower portion of the seed crystal using the dash neck technique so that the dislocation is diverted toward the surface of the neck portion. After the removal of the dislocation is confirmed, a shoulder is formed to extend the single crystal to have a prescribed diameter. Thereafter, a straight waist to be single crystal product (hereafter a straight waist product portion) will be formed.

Meanwhile, in recent years, because of an increase in the weight of the single crystal due to an increase of its diameter and length, the strength of the neck is approaching to the limit. Therefore, the conventional pulling method may break the neck and cannot grow the single crystal safely. To overcome such an inconvenience, a device and method have been proposed which replace a part of the weight load from the neck into a holding tool while the single crystal is grown. Such a device or method, which supports most of the weight of the single crystal by the holding tool, prevents the neck from being broken and the single crystal from dropping from the holding tool even when the neck is broken.

However, the conventional single crystal pulling method or holding device has several problems.

(1) It is known that the single crystal of silicon is deformed plastically within a temperature range from the melting point to 75° C. Therefore, when the silicon single crystal is held in the above temperature range, it is deformed plastically. This makes it impossible to hold the single crystal safely and surely, and may generate dislocation in the single crystal. In addition, contact of a holding tool with the single crystal in the aforementioned high temperature range will contaminate the single crystal.

(2) In Japanese Patent Publication.(JP-B) No. 5-65477, several methods are disclosed for forming a constriction of the single crystal used when the single crystal is held for using the holding tool in the step of increasing the diameter after the neck has been formed. The constriction can be formed by controlling the shape of the single crystal in such a manner that the crystal pulling speed and melt are adjusted. However, it is difficult to form the desired shape with good reproducibility so that the relative positions of the holding tool and constriction differ for different single crystals. This makes it impossible to hold the single crystal safely and surely.

(3) JP-A (Laid-Open) 9-2893 discloses a method of holding the single crystal without forming the constriction in which a hanging tool is engaged in the concave portion in a bulge generated after the dislocation is removed in the neck. This method, however, fails to refer to the mechanical sandwiching force applied to the concave portion. Since the concave portion created after the dislocation has been removed in the neck has a small diameter, it is necessary to control the holding force in order to hold the single crystal safely and surely.

(4) In the method of (3), if the pinching force applied to the concave portion having a small diameter is balanced completely, no problem occurs. But if the center axis thereof is shifted, the picking force will on the concave portion as a bending force. This may break the concave portion easily. In this case, there are dangers of damaging the pulling furnace body or accidents resulting in injury and death. The resulting damage is immeasurable.

(5) In the method of (3), in the case of a method of holding an inverted right conical portion at the straight waist or concave portion of the bulge created intentionally, a hanging tool made of a different substance from the single crystal is brought into direct contact with the area to be used as a product so that it will be contaminated.

(6) In order to replace the weight of the crystal from the neck into the holding tool smoothly, it is desired that the weight of the crystal is small at the time of replacement. If the weight of the crystal is small, dislocation, even if it occurs, can be dealt with by the conventional method. The crystal free from the dislocation can be obtained by the subsequent pulling step. However, the straight waist of the single crystal can be actually picked up only after the single crystal has been grown to a prescribed length. The first reason is that short crystal is high in temperature so that plastic deformation, dislocation or contamination is likely to occur.

The second reason is attributable to the structure of the crystal pulling device. Specifically, a contracted bellows, a gate chamber and a top chamber are located beneath the holding tool so that the crystal length from a surface of the melt to the position of holding is lengthened necessarily. If the arm of the holding tool is lengthened correspondingly, it will be opened and useless when a picking force is applied. Accordingly, the holding operation can be substantially carried out only after the single crystal has been grown to a considerable length, i.e. the weight of crystal has been increased.

SUMMARY OF THE INVENTION

An object of the present invention is to provide a method for pulling a large weight of single crystal by the CZ process which can safely and surely hold a portion with good shape reproducibility of the single crystal and pull up it without generating deformation, dislocation and contamination.

Another object of the present invention is to provide a single crystal holding device for use in the above single crystal pulling method.

In order to attain the above object, the single crystal holding method according to the present invention is characterized in that after seed crystal is immersed in a melt and dislocation is removed from the single crystal in a diameter contracting step, prior to forming a straight waist product portion of the single crystal having a prescribed diameter, a straight waist holding portion having a smaller diameter than the prescribed diameter is formed and the single crystal is pulled up while the straight waist holding portion is held by a single crystal holding device.

A first aspect of the method is a single crystal pulling method of the present invention, which comprises the steps of:

immersing seed crystal in a melt;

growing a single crystal around the seed crystal and reducing its diameter to remove dislocation in the single crystal;

prior to forming a straight waist product portion of single crystal having a prescribed diameter, forming a straight waist holding portion having a diameter smaller than the prescribed diameter;

holding said straight waist holding portion by using a single crystal holding device; and pulling the straight waist product portion while the straight waist holding portion is held.

According to the above aspect, since the straight waist holding portion with good shape reproducibility is held by the single crystal holding device, it can be surely held. The straight waist holding portion is excluded from the area for product so that the area for product is not contaminated by contact with the holding device.

A second aspect of the method is a single crystal pulling method according to the first aspect, wherein said step of forming the straight waist holding portion comprises a step of varying a pulling speed to make unevenness in the surface thereof.

According to the aspect, since unevenness is formed in the surface of the straight waist holding portion, a large contact area of the straight waist holding portion with a holding tool is assured, thereby permitting the single crystal having a large diameter to be pulled safely.

A third aspect of the method is a single crystal pulling method according to the second aspect, wherein said step of forming the straight waist holding portion comprises a step of varying the pulling speed intermittently.

According to the aspect, since regular unevenness is formed in the surface of the straight waist holding portion, a large contact area of the straight waist holding portion with a holding tool is assured, thereby permitting the single crystal having a large diameter to be pulled safely.

A fourth aspect of the method is a single crystal pulling method according to the first aspect, wherein the diameter of the straight waist holding portion is 50–100 mm.

According to the aspect, since the straight waist holding portion has a diameter suitable to be held by the holding device, the single crystal having a large diameter can be pulled safely.

A fifth aspect of the method is a single crystal pulling method according to the first aspect, wherein the diameter of the straight waist holding portion is within a range from $1/6$ to $1/4.5$ of that of the straight waist product portion.

According to the aspect, the straight waist holding portion has a diameter and a length enough to support a single crystal having a large diameter, or has a much smaller diameter than that of a straight waist product portion. In this case, the straight waist holding portion is cooled to a plastic deformation temperature or lower in a relatively short time. Therefore, the single crystal can be held by the holding device before its weight becomes large, and the weight thereof can be smoothly replaced from a neck into the holding device. Further, since the straight waist has a diameter suitable to be supported by the holding device, the single having a large diameter can be pulled up safely. Additionally, if the straight waist holding portion has a diameter smaller than $1/6$ of that of the straight waist product portion, it cannot have sufficient strength against the holding force, and also a sufficient contact area with a holding pad, thereby making it impossible to be held surely. On the other hand, if it exceeds $1/4.5$, the pulling speed of the straight waist holding portion is reduced, thereby taking a long time to be cooled to a temperature capable of holding the straight waist holding portion. If the time required to grow the straight waist holding portion is increased, the danger of generating dislocation in an area for product will be enhanced because a quartz crucible is deteriorated with a passage of time. For this reason, it is desired to save the time taken to form the straight waist holding portion and reduce risk of poorness in the product area. It is also desired to reduce the material to be consumed for the area to be disposed, to as much a degree as possible. Furthermore, preferably, the straight waist holding portion has a diameter from 2 inches to 4 inches. If it is larger than 4 inches, the time required to grow the straight waist holding portion is prolonged. If it is smaller than 2 inches, sufficient strength against the holding force cannot be obtained.

A sixth aspect of the method is a single crystal pulling method according to the first aspect, wherein said step of holding said straight waist holding portion comprises holding it at a position where the temperature of the center region becomes lower than a plastic deformation temperature of the single crystal.

According to this aspect, the straight waist holding portion can be surely held.

A seventh aspect of the method is a single crystal pulling method according to the first aspect, further comprising, prior to pulling the single crystal, the step of:

measuring a temperature profile of the straight waist holding portion to define the position where the temperature of the center zone becomes lower than a plastic deformation temperature of the single crystal.

According to this aspect, the straight waist holding portion can be surely held.

An eighth aspect of the method is a single crystal pulling method according to the seventh aspect, wherein said measuring step further comprises a step of measuring a temperature profile of dummy crystal with a thermocouple embedded in the straight waist holding portion to define the position where the temperature of the center region becomes lower than a plastic deformation temperature of the single crystal.

According to this aspect, since the position of the straight waist holding portion whose temperature becomes lower than a plastic deformation temperature is previously measured, it can be held at an optimum position. Thus, the single crystal can be surely pulled at a high speed and efficiently.

A ninth aspect of the method is a single crystal pulling method according to the first aspect, wherein said step of holding the straight waist holding portion is to hold the straight waist holding portion by the single crystal holding device at a position where the center zone of said straight waist holding portion is apart from the surface of said melt by about 600 mm.

A tenth aspect of the method is a single crystal pulling method according to the first aspect, wherein said step of holding the straight waist holding portion is to hold the straight waist holding portion by the single crystal holding device after the temperature of said straight waist holding portion has lowered to 750° C. or lower.

According to the aspect, since the straight waist holding portion is held by the single crystal holding device after it is cooled to about 75° C. which is a lower limit of a plastic deformation temperature range of silicon, the straight waist holding portion is not deformed. Hence, the single crystal can be pulled up while it is held safely, and does not suffer from dislocation and is not contaminated. Since the straight waist holding portion has a smaller diameter than that of the straight waist product portion, it can be grown at a high pulling speed and reaches 750° C or lower in a relatively short time.

An eleventh aspect of the method is a single crystal pulling method according to the first aspect, wherein in said step of holding the straight waist holding portion, it is held by a holding pad arranged to be in plane-contact therewith.

A twelfth aspect of the method is a single crystal pulling method according to the second aspect, wherein said step of holding the straight waist holding portion is to hold it by a holding pad which covers unevenness formed on the surface in the step of forming the straight waist holding portion and is arranged in plane-contact with an outer surface thereof.

A thirteenth aspect of the method is a single crystal pulling method according to the first aspect, wherein said step of holding the straight waist holding portion is to hold it by a holding pad which is in plane-contact with at least a half circle of said straight waist holding portion.

According to the aspect, the straight waist holding portion can be held in a large area, and hence surely held.

A fourteenth aspect of the method is a single crystal pulling method according to the second aspect, wherein said straight waist holding portion is held by a force larger than the value of weight of the single crystal divided by the friction coefficient of the single crystal.

According to this aspect, with the straight waist holding portion with no unevenness engaged with a single crystal holding device, the single crystal can be pulled up while it is held without being slid.

A fifteenth aspect of the device is a single crystal holding device for holding according to the present invention, which comprises:

a plurality of arms which are vertically movable; and a plurality of holding pads arranged on lower ends of said plurality of arms, respectively and kept in plane-contact with said straight waist holding portion According to the aspect, the straight waist holding portion can be surely held.

A sixteenth aspect of the device is a single crystal holding device for holding according to the fifteenth aspect, wherein each of said holding pads is in plane-contact with at least a half circle of said straight waist holding portion.

A seventeenth aspect of the device is a single crystal holding device for holding according to the sixteenth aspect, wherein each of said holding pads is made of a flexible material.

An eighteenth aspect of the device is a single crystal holding device for holding according to the sixteenth aspect, wherein each of said holding pads has a holding pad body and a metallic holding region fixed on the holding pad body and having unevenness in a surface thereof.

A nineteenth aspect of the device is a single crystal holding device for holding according to the eighteenth aspect, wherein said metallic holding region is made of a mesh-like refractory material selected from the group consisting of tantalum, nickel and copper.

A twentieth aspect of the device is a single crystal holding device for holding according to the eighteenth aspect, wherein said metallic holding region is made of a refractory material selected from the group consisting of tantalum, nickel and copper and has grooves in a surface thereof.

According to the aspect, since unevenness is formed in the surface of the straight waist holding portion, it can have a contact area with the holding pad, thereby increasing the holding strength. Particularly, if the straight waist holding portion with the unevenness in the surface is held by a mesh-like holding pad, its very strong holding can be realized.

A twenty first aspect of the device is a single crystal holding device for holding according to the fifteenth aspect, wherein each of said holding pads holds said straight waist holding portion by a force larger than the value of weight of the single crystal divided by the friction coefficient of the single crystal and has a contact area providing holding force acting on the single crystal to be smaller than 11 GPa which is the breaking stress limit of silicon.

The single crystal holing device holds the straight waist holding portion formed on the upper end of the single crystal by a force larger than the value of the weight of the single crystal divided by the friction coefficient of silicon. In this case, the holding member arranged at the lower end of a holing arm has a contact area providing stress applied to the straight waist holding portion to be lower than 11 GPa. Therefore, the straight waist can be held without being broken.

The above and other objects and features of the present invention will be more apparent from the following description taken in conjunction with the accompanying drawings.

BRIEF DESCRIPTION OF THE DRAWING

FIG. 8 is a table showing a manner of concrete control for carrying out the method shown in FIG. 7.

DESCRIPTION OF THE PREFERRED EMBODIMENTS

Figure 1:
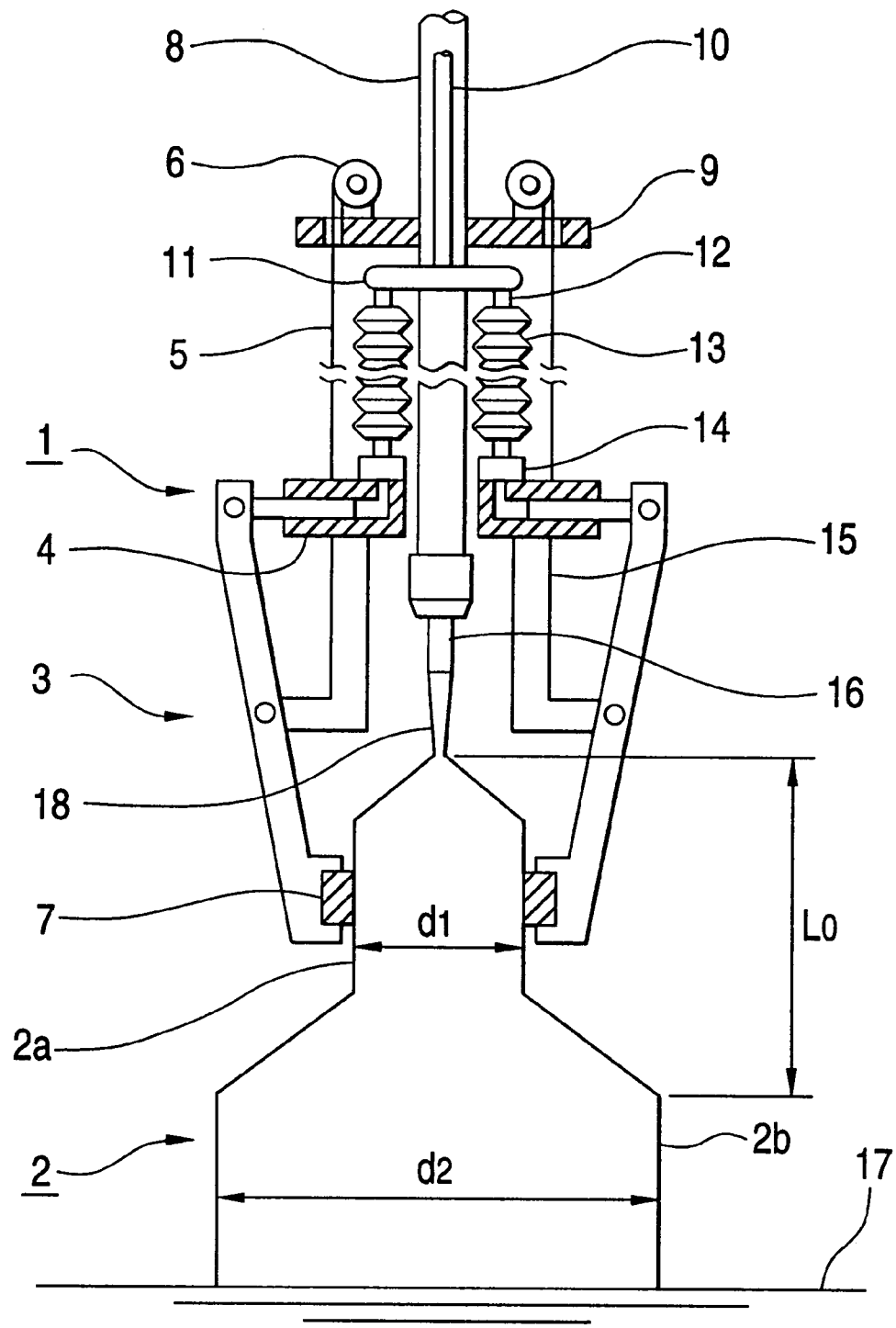
FIG. 1 is a front view showing the schematic configuration of a single crystal holding device.

Now referring to the drawing, an explanation will be given of an embodiment of a single crystal pulling method and a single crystal holding device according to the present invention. The single crystal holding device according to the present invention has the same structure as that disclosed in JP-A-7-172,981. FIG. 1 shows a schematic view showing one example of the structure thereof.

Figure 2A:
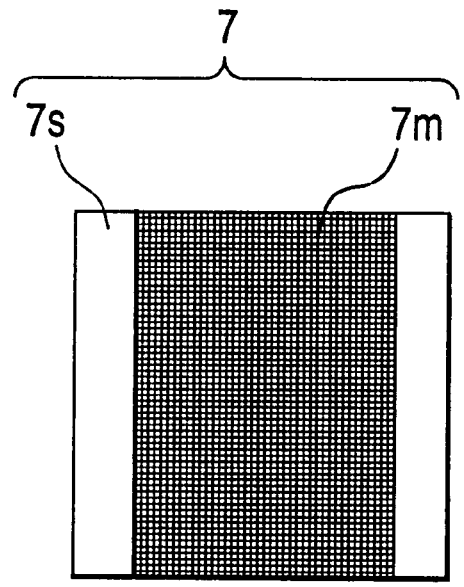
FIGS. 2A and 2B are a plan view viewed from an internal direction and a top view of a holding pad used in the holding device according to the present invention, respectively.
Figure 2B:
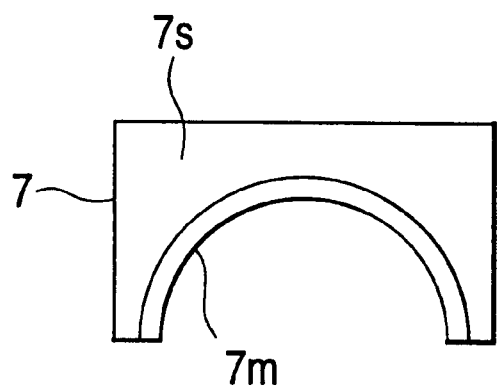
Figure 3:
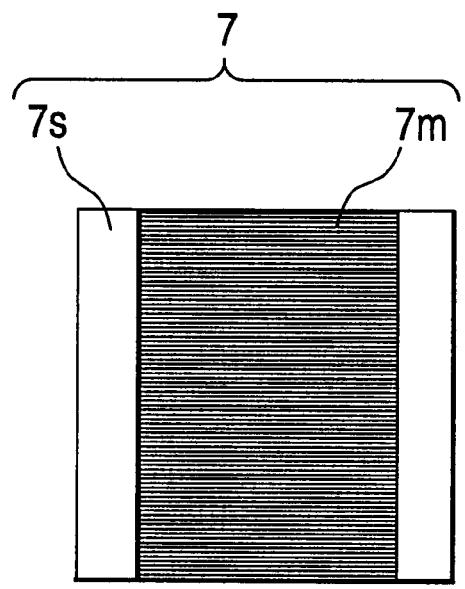
FIGS. 3 and 4 are views showing other embodiments of a holding pad used in the holding device according to the present invention.
Figure 4:
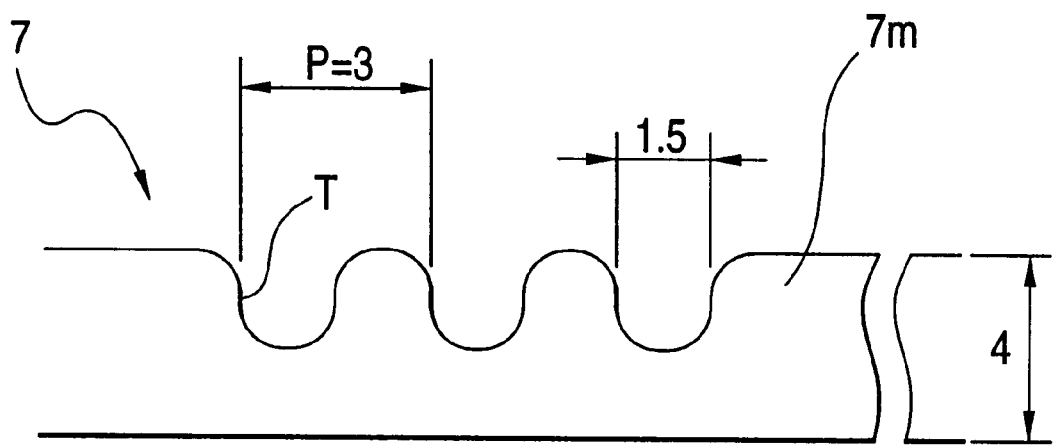

A single crystal holding device 1 is installed in a single crystal fabricating apparatus (not shown). The single crystal holding device 1 includes a plurality of arms 3 for holding a straight waist holding portion 2a of a single crystal being pulled up, air cylinders 4 for driving these holding arms 3 and take-up drums 6 for taking up wires 5 bound with the air cylinders 4, respectively. Holding pads 7 are attached to the lower ends of the holding arms 3, respectively. Each holding pad 7 has a curvature having the radius equal to that of the straight waist holding portion 2a and is made of a soft refractory material such as tantalum, nickel or copper, preferably an annealed material of such metal, at least on the side of the holding face. The holding pad 7, as seen from FIGS. 2A and 2B, is composed of a pad body 7s having a sectional semi-circular groove and a mesh area 7m fixed on the groove. The mesh area is made of a soft refractory material such as tantalum, nickel or copper, preferably an annealed material of such metal. The mesh area may be formed in a manner of rows and columns or in a manner of columns in which recesses are formed only in a horizontal direction as shown in FIG. 3. Further, as seen from a sectional view of FIG. 4, the holding pad 7 may be a structural body which is made of a soft refractory material such as tantalum, nickel or copper, preferably an annealed material of such metal and have grooves T each formed on the surface so as to have a depth of 1–2 mm and a width of 1–2 mm at intervals of 2–4 mm. Each take-up drum 6 is driven by a driving motor (not shown) placed on a disk 9 fixed to a pulling shaft 8. The air cylinder 4 is operated by inert gas which is supplied through a conduit 10 provided along a pulling shaft 8, a circular conduit 11 connected thereto and surrounding the pulling shaft 8, and a plurality of conduits 12, bellows 13 and valves 14 which are connected to the circular conduit 11. The upper end of an L-shaped member 15 is secured to the air cylinder 4, while the lower end thereof is coupled with the holding arm 3. The holding arm 3 whose upper end is rotatably coupled with a piston rod of the air cylinder 4, and swings at a fulcrum of its portion coupled with the L-shaped member 15 by expansion/contraction of the air cylinder 4.

The single crystal fabricating apparatus includes a light sensor for detecting the position in the vicinity of the upper end of each holding arm 3. The light sensor includes a light emitting element for making laser oscillation in a horizontal direction and a light receiving element for detecting the wavelength of the oscillation. When the upper end of the holding arm 3 is pushed by a prescribed amount by the air cylinder 4, laser light is cut off. At the same time, a valve 14 operates so that the operation of the air pressure cylinder 4, i.e., its holding operation is stopped temporarily. Subsequently, the valve is half opened and the flow rate of the inert gas is adjusted so that the operation speed of the air cylinder 4 becomes very slow. Thus, the holding pad 7, which may be made of flexible material, i.e. elastic body, is brought into contact with the straight waist holding portion without applying shock or vibration thereto to hold it.

When the single crystal is pulled up, the wire 5 is taken up so that the single crystal holding device is shifted upward. The seed crystal 16 is immersed in the melt 17 to make its conformity therewith. Then, a squeezing step will be done. After the neck 18 is formed to remove dislocation of the single crystal, the first time diameter enlargement is made. The straight waist holding portion 2a having a smaller diameter d1 than a prescribed diameter d2 of the straight waist product portion 2b is grown to have a suitable length. The second time diameter enlargement is made to form the straight waist product portion 2b having the prescribed diameter d2. After the temperature of the straight waist holding portion 2a becomes lower than 750° C., the single crystal 2 is held by the single crystal holding device 1. Since the straight waist holding portion 2a is thinner than the straight waist product portion, the pulling speed is high and hence the cooling time to reach 750° C. is relatively short correspondingly. Thus, the temperature of the straight waist holding portion lowers lower than the zone of plastic deformation temperature before the weight of the single crystal is not so great, because the cooling speed is relatively high. The temperature of the straight waist holding portion 2a and weight of the single crystal 2 can be controlled on the basis of the diameter and length of the straight waist holding portion 2a. The temperature profile of the straight waist holding portion 2a is previously measured using dummy crystal with a thermo-couple embedded in the straight waist holding portion 2a.

In FIG. 1, the portion L0 of the single crystal from the lower end of the neck 18 to the upper end of the straight waist product portion 2b is disposed as a region excluded from an object for product. As compared with the risk and time loss to be taken when the single crystal being grown generates dislocation, several hours and material loss for forming the straight waist holding portion in the diameter enlargement step are very small. Rather, sure holding of the single crystal, with the temperature and weight in holding controlled, provides higher productivity. The process according to the present invention can realize safe holding of the single crystal without generating deformation or dislocation, and engages the holding member with the area excluded from the object for product so that the single crystal is not contaminated.

In order to hold the single crystal by the holding arm 3, force is required that is larger than the value of the weight of the single crystal 2 divided by the friction coefficient of the single crystal. However, excessive force applied to the single crystal gives rise to chipping on the surface of silicon so that fragments of the silicon will drop into the melt. When they reach the boundary of grown crystal, the single crystal will suffer from dislocation. Further, excessively great holding force may break the single crystal.

Assuming that the weight of the single crystal is W (kg) and the friction coefficient of the surface of single crystal of silicon is $\mu$, when the single crystal is held by the holding pad 7 engaged with the straight waist holding portion 2a, the force $f$ (kg/mm$^2$)for holding the single crystal may be greater than W/$\mu$. However, since excessive picking force may break the single crystal, assuming that the contact area between the holding pad and silicon single crystal is A, the pressure P at the contact area can be expressed by $$P=(W/\mu)/A$$

According to the report from F. Ericson, S. Johansson and J. A. Schweize; Mat. Sci. Engi. A105/106. 131(1988), the breaking limit pressure of silicon can be estimated to be 11 GPa. Therefore, condition of the picking force that the holding pad must have can be expressed by $$P=(W/\mu)/A \leq 11 \text{ GPa}$$

When the picking force of the holding pad exceeds this value, the silicon may give rise to chipping. In order to prevent this, a suitable contact area A is given to the holding pad 7. In addition, the straight waist may be grown by the MCZ technique for the purpose of improving the contact state between the holding pad 7 and straight waist holding portion-2a.

An explanation will be given of a process for pulling up the single crystal. The neck is formed according to the ordinary crystal growth process. Thereafter, a diameter enlargement process is executed. Specifically, in a first time diameter enlargement step, in order to form the straight waist holding portion 2a (diameter d1) for holding, when the diameter becomes 4 inches, the pulling speed is accelerated to stop the diameter enlargement. Thereafter, in order to maintain the diameter of 4 inches, power of a used heater and pulling speed are adjusted. Thus, the straight waist holding portion having a length of several hundreds of millimeters is formed. In a second time diameter enlargement step, while the temperature of the melt and pulling speed are controlled, the diameter of the single crystal is increased to 310 mm to carry out the step of growing the straight waist product portion 2b.

In the first embodiment, the straight waist product portion 2b is grown before the temperature of the straight waist holding portion 2a is lowered to 750° C. During the time, the holding device 1 is caused to be on stand by at a prescribed position so that it is previously heated sufficiently. The temperature profile in an axial direction within a furnace is previously measured using dummy crystal with a thermocouple embedded in the straight waist 2a for holding.

When the single crystal is pulled up at a position where the straight waist holding portion is at 750° C. or less, the weight of the crystal becomes 60 kg. Then, the straight waist holding portion 2a is held by the single crystal holding device 1. The holding operation can be carried out smoothly. Thus, the single crystal can be pulled until its weight reaches 200 kg.

In a second embodiment, with a thermocouple embedded in the holding pad 7, the straight waist holding portion 2a is held before its temperature lowers to 750° C. Low pinching force is given to the holding pad so that the straight waist holding portion 2a does not suffer from plastic deformation. After it is confirmed from a detection signal from a thermocouple that the temperature of the straight waist holding portion has lowered to 750° C. or lower, the picking force is increased to a prescribed value of 11 GPa or less. Like the first embodiment, in the second embodiment also, the single crystal can be pulled up until its weight reaches 200 kg. For example, where the single crystal, with the straight waist product portion having a diameter of 310 mm and a length of 1 m is to be pulled up, the straight waist holding portion, even when its diameter is set at 50 mm, can have strength enough to be held. If the process is shifted to the step of growing the straight waist for product after the straight waist holding portion is grown to a length enough to be held, the temperature of the straight waist holding portion is cooled to 750° C. at a relatively early time. The load or weight can be replaced smoothly from the neck into the single crystal holding device. In this embodiment, although the single crystal holding device was mounted in a shaft system of single crystal fabricating apparatus, it may mounted in a wire system of single crystal fabricating apparatus.

In the above embodiments, the straight waist holding portion is formed to have a uniform diameter. However, the area for holding can be increased by varying the pulling speed in a pulse shape or intermittently, or forming unevenness in the surface thereof. Thus, the straight waist can be surely held.

Figure 5:
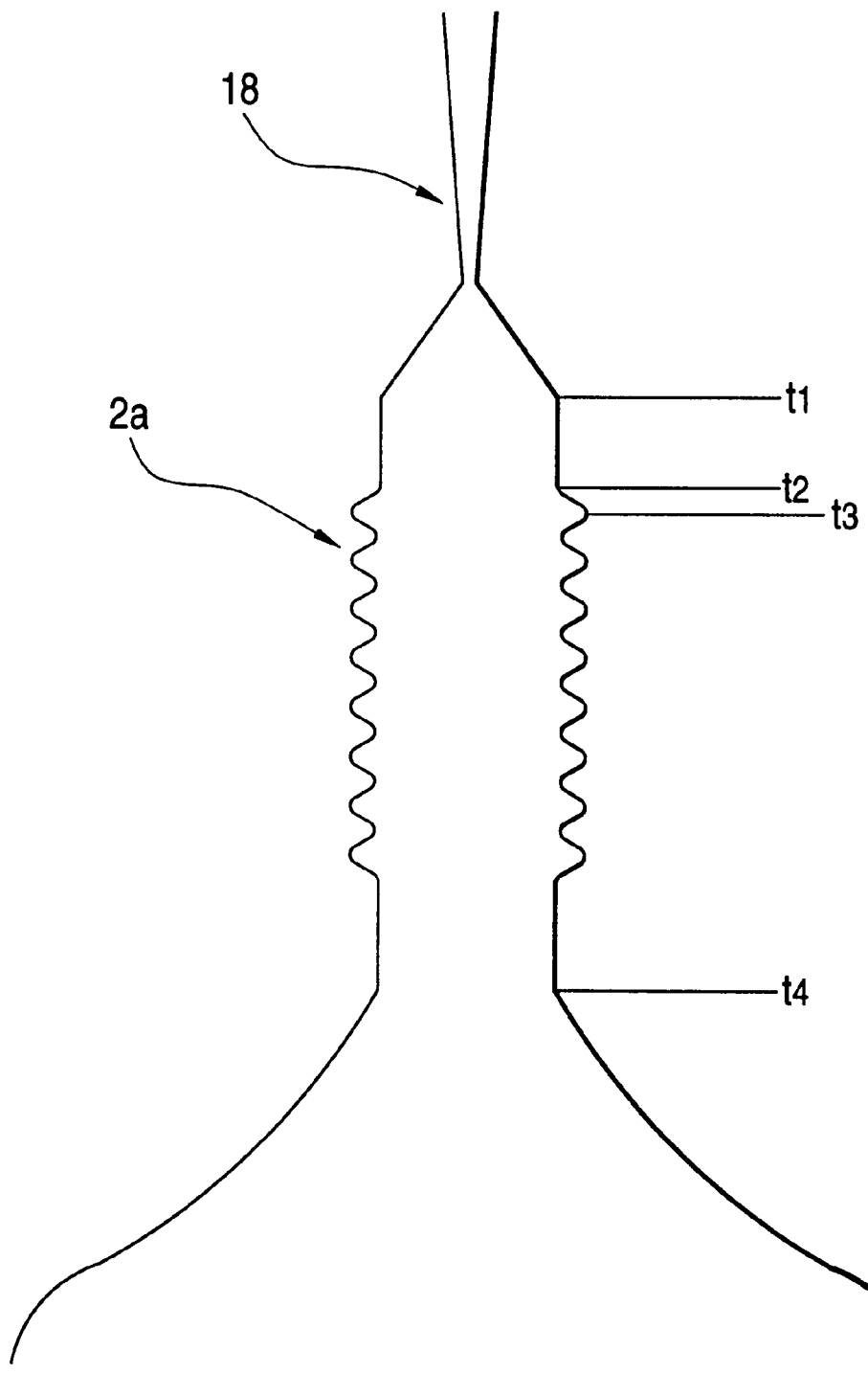
FIG. 5 is an enlarged view of the main part of a straight waist holding portion of single crystal formed by the method of pulling according to the third embodiment of the present invention.

In a third embodiment, as seen from an enlargement view of a main part of FIG. 5, the straight waist holding portion is formed while varying the pulling speed regularly to make changes of several millimeters in diameter to provide unevenness in the surface. As understood from a graph of FIG. 6, the pulling speed may be varied intermittently.

Figure 6:
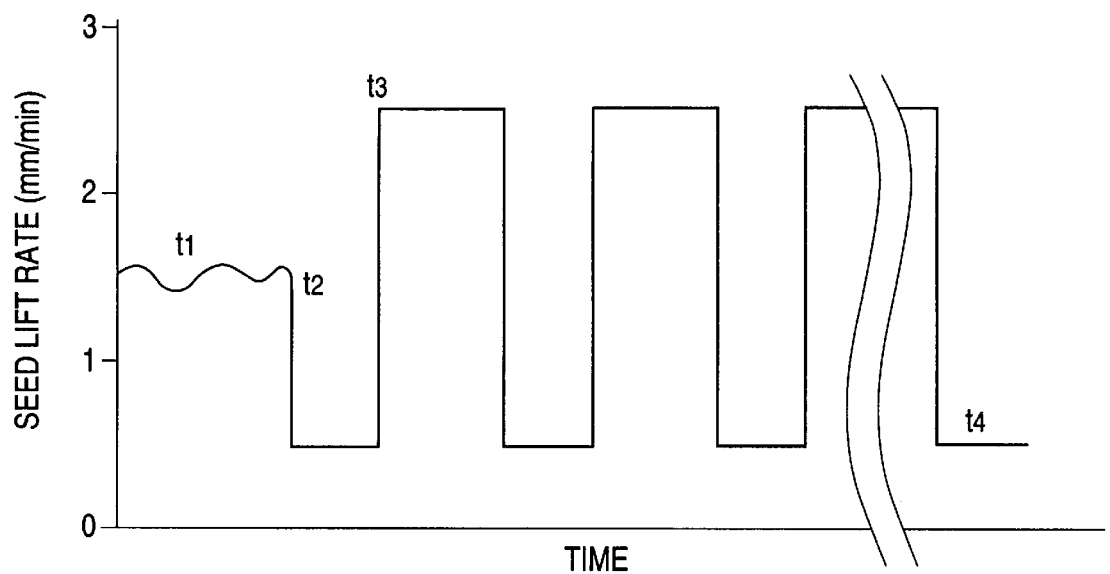
FIGS. 6 and 7 are graphs each showing the manner of pulling control in the pulling method according to the third embodiment of the present invention, respectively.

In FIG. 6, the ordinate represents a pulling speed and the abscissa represents a time. In the example shown in FIG. 6, a pulling speed prescribed for obtaining a target diameter is increased or decreased intermittently regularly to make unevenness in the surface of the straight waist holding portion as shown in FIG. 5.

Figure 7:
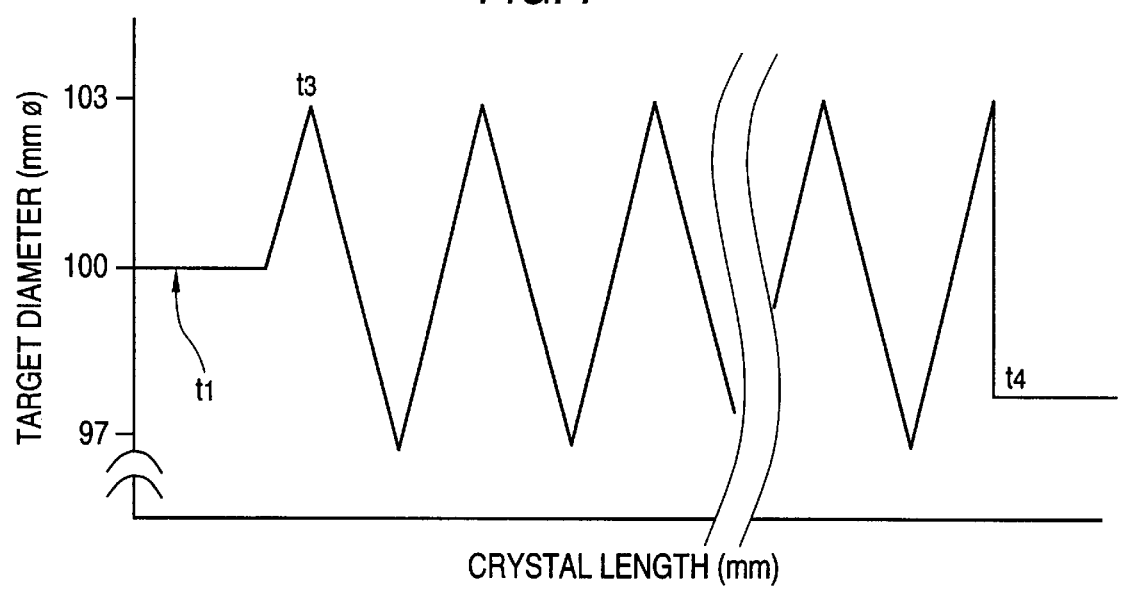

In FIG. 7, the ordinate represents a target diameter and the abscissa represents a length of the crystal. In this example, the target diameter is specified relatively to the length of crystal to make unevenness in the surface of the straight waist holding portion.

In both examples, at time t1, the diameter is controlled to provide a diameter of an ordinary straight waist holding portion; at time t2, the pulling speed is decreased to increase the diameter of the single crystal; at time t3, the pulling speed is increased to reduce the diameter of the single crystal; and at time t4, the crystal diameter is enlarged into that of the straight waist product portion. In FIG. 8. an example of a relation between a crystal length and target diameter.

Thus, by making unevenness in the surface of the straight waist holding portion, a large contact area of the straight waist with the holding pad can be assured, thus increasing the holding strength. Particularly, when the straight waist holding portion with such evenness formed in the surface is held by the mesh-like holding pad 7 as shown in FIGS. 2 and 3, a very strong holding condition can be achieved.

In accordance with the present invention, the following advantages can be obtained.

(1) The straight waist holding portion can be formed under much easier control of its shape and size than the conventional method in which its diameter is once enlarged and thereafter shrunk to form a neck.

(2) Where the single crystal is held by a single crystal holding device, any position of the straight waist holding portion may be held. Namely, the holding position can be selected with great freedom so that position control of the holding device can be made much more easily than the case of holding the neck.

(3) Since the straight waist holding portion having a smaller diameter than the straight waist product portion is held, the holding device can be down sized and weight-reduced.

(4) By forming unevenness in the surface of the straight waist holding portion, a large contact area of the straight waist holding portion with a holding pad can be assured, thereby increasing the holding strength.

(5) By forming the holding pad of mesh-like metal, flexibility and elasticity is given, thereby increasing the holding strength for holding the straight waist.

(6) Since the straight waist holding portion is held by a picking force less than the breaking stress after the temperature of the straight waist holding portion has lowered to that of plastic deformation, the straight waist holding portion can be held safely and surely without suffering from deformation or breaking by the single crystal holding device.

(7) Unlike the conventional single crystal holding method, since the single crystal does not suffer from dislocation, contamination and dropping, productivity of the single crystal can be improved.

(8) When the length of the straight waist holding portion is increased to a certain degree, or the diameter thereof is made sufficiently smaller than that of the straight waist product portion, the straight waist holding portion can be cooled to the temperature of plastic deformation in a relatively short time. For this reason, the single crystal can be held by the holding device before its weight becomes large. Thus, the weight can be shifted smoothly from the neck to the holding device. Even if the single crystal suffers from dislocation, it can be molten back in the ordinary manner.

What is claimed is:

1. A single crystal pulling method comprising the steps of:
   immersing a seed crystal in a melt;
   growing a single crystal around the seed crystal and reducing its diameter to remove dislocation in the single crystal;
   prior to forming a straight waist product portion of the single crystal having a prescribed diameter, forming a straight waist holding portion having a diameter smaller than the prescribed diameter;

holding said straight waist holding portion by using a single crystal holding device; and pulling the straight waist product portion while the straight waist holding portion is held.

2. The single crystal pulling method according to claim 1, wherein said step of forming the straight waist holding portion comprises a step of varying a pulling speed to make unevenness in a surface thereof.

3. The single crystal pulling method according to claim 2, wherein said step of forming the straight waist holding portion comprises a step of varying the pulling speed intermittently.

4. The single crystal pulling method according to claim 2, wherein said step of holding the straight waist holding portion is to hold it by a holding pad which covers unevenness formed in the surface in the step of forming the straight waist holding portion and is arranged in plane-contact with an outer surface thereof.

5. The single crystal pulling method according to claim 2, wherein said straight waist holding portion is held by force larger than a value of weight of the single crystal divided by the friction coefficient of the single crystal.

6. The single crystal pulling method according to claim 1, wherein the diameter of the straight waist holding portion is 50–100 mm.

7. The single crystal pulling method according to claim 1, wherein the diameter of the straight waist holding portion is within a range from 1/6 to 1/4.5 of that of the straight waist product portion.

8. The single crystal pulling method according to claim 1, wherein said step of holding said straight waist holding portion comprises holding it at a position where a temperature of the center region becomes lower than a plastic deformation temperature of the single crystal.

9. The single crystal pulling method according to claim 1, further comprising, prior to pulling the single crystal, the step of:

measuring a temperature profile of the straight waist holding portion to define a position where a temperature of the center zone becomes lower than a plastic deformation temperature of the single crystal.

10. The single crystal pulling method according to claim 9, wherein said measuring step further comprises a step of measuring a temperature profile of dummy crystal with a thermocouple embedded in the straight waist holding portion to define a position where a temperature of a center region becomes lower than a plastic deformation temperature of the single crystal.

11. The single crystal pulling method according to claim 1, wherein said step of holding the straight waist holding portion is to hold the straight waist holding portion by the single crystal holding device at a position where a center zone of said straight waist holding portion is apart from a surface of said melt by about 600 mm.

12. The single crystal pulling method according to claim 1, wherein said step of holding the straight waist holding portion is to hold the straight waist holding portion by the single crystal holding device after a temperature of said straight waist holding portion has lowered to 750° C. or lower.

13. The single crystal pulling method according to claim 1, wherein in said step of holding the straight waist holding portion, it is held by a holding pad arranged to be in plane-contact therewith.

14. The single crystal pulling method according to claim 1, wherein said step of holding the straight waist holding portion is to hold it by a holding pad which is in plane-contact with at least a half circle of said straight waist holding portion.

* * * * *